(12) United States Patent
Lu et al.

(10) Patent No.: US 6,383,715 B1
(45) Date of Patent: May 7, 2002

(54) STRONGLY WATER-SOLUBLE PHOTOACID GENERATOR RESIST COMPOSITIONS

(75) Inventors: Zhijian Lu; Alois Gutman, both of Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/605,571

(22) Filed: Jun. 28, 2000

(51) Int. Cl.7 ................................................ G03F 7/004
(52) U.S. Cl. .................................... 430/270.1; 326/914
(58) Field of Search .............................. 430/270.1, 326, 430/914

(56) References Cited

U.S. PATENT DOCUMENTS

| | | | | |
|---|---|---|---|---|
| 5,648,196 A | * | 7/1997 | Frechet et al. | 430/270.1 |
| 5,683,856 A | * | 11/1997 | Aoai et al. | 430/270.1 |
| 5,837,420 A | * | 11/1998 | Aoai et al. | 430/270.1 |
| 5,965,319 A | * | 10/1999 | Kobayashi | 430/176 |
| 6,051,370 A | * | 4/2000 | Kim | 430/326 |

* cited by examiner

*Primary Examiner*—Rosemary Ashton

(57) ABSTRACT

A chemically amplified resist composition that eliminates blob defects when used to produce semiconductor devices comprising: a base polymer with a protected group; a solvent; and a photoacid generator comprising an iodonium salt containing a water-soluble group of a sulphonium group containing a water-soluble group.

2 Claims, 1 Drawing Sheet

ENLARGED CONTACTS AT A DEFECT CENTER

STRONGLY WATER-SOLUBLE PHOTOACID GENERATOR RESIST COMPOSITIONS

BACKGROUND OF THE INVENTION

1. Field of the Invention

The invention relates to strongly water-soluble photoacid generator resist compositions that eliminate post-development defects in resist technology, and more particularly, to pattern-forming resist materials in which the resist patterns are formed on a substrate base material, i.e., a semiconductor material during production of semiconductor devices that are used in dynamic random access memory (DRAM) and logic devices.

2. Description of Related Art

As the minimum feature size of semiconductor devices becomes smaller and smaller, defect control becomes more important and the challenge to achieve a high product yield becomes more formidable. Starting from the qualification of 256M DRAM technology, a class of special defects so called "Blob Defects" was discovered on a nested contact hole level called CB using a chrome on glass mask and JSR M20G resist.

Later on blob defects were observed to a varying degree with all DUV resists, such as Shipley UV2HS, UV6Hs and JSR M60G, regardless of whether the resist chemistry was tert-butoxycarbonyl (t-BOC) or acetal-based. It was found that, the better the resist contrast and surface inhibition, the higher the blob defect density. Therefore, the selection of contact hole resist for patterning even a smaller contact hole size must face a compromise between defect density and lithographic performance, which is not compatible with the trend of IDW k1 printing. Moreover, no resist evaluated so far shows zero blob defect density. Nevertheless, blob defects of necessity becomes a limiting factor in resist selection and yield enhancement.

U.S. Pat. No. 4,245,029 discloses that oxirane containing aliphatically unsaturated organic materials can be cured by a simultaneous free-radical and cationic mechanism, to obtain improved characteristics in the final product; namely, solvent resistance. Simultaneous free-radical and cationic cure of oxirane containing aliphatically unsaturated materials are achieved by using triarylsulfonium salts in the oxirane containing aliphatically unsaturated organic materials and the exposure of the photocurable compositions to radiant energy such as ultraviolent light.

Photoacid generators(PAGs) and use of the same in chemically amplified resist compositions are disclosed in U.S. Pat. No. 5,733,704. The resist composition is one in which high resolution patterns can be formed in a lithography process, due to its high sensitivity to light and large difference in solubilities in a developing solution before and after exposure to light. The resist composition is suitable for manufacturing highly integrated semiconductor chips.

U.S. Pat. No. 5,736,296 disclose an improved, chemically-amplifying positive resist composition for radiations of UV rays, deep-UV rays, excimer laser beams, X-rays and electron beams, wherein the composition comprises a resin component whose solubility in an alkaline aqueous solution is increased by the action of acids, and a compound which generates an acid when exposed to radiations. The composition is useful for forming fine patterns in producing ultra-large scale integration (ULSIs) devices.

A process for the formation of a negative resist pattern is disclosed in U.S. Pat. No. 5,017,461, comprising preparing a mixture of water-soluble polymeric material having at least one hydroxyl group with a photoacid generator capable of releasing an acid upon radiation exposure, coating a solution of the resist material onto a substrate to form a resist layer, exposing the layer to patterned radiation, heating the exposed resist layer in the presence of an acid as a catalyst to remove water, and developing a resist layer with water to remove unexposed areas to form a resist pattern on the substrate.

None of the foregoing references provide any measures for photoacid generators (PAGs) in resist formulations that avoid blob defect formation.

SUMMARY OF THE INVENTION

One object of the present invention is to provide a strongly water-soluble photoacid generator in resist compositions that avoids blob defect formation.

Another object of the present invention is to provide strongly water-soluble photoacid generators in resist compositions to prevent the precipitation of non-decomposed PAG in the developer composition.

A further object of the present invention is to provide a strongly water-soluble PAG in resist compositions to prevent blob defect formation by incorporating certain water-soluble groups, such as —OH into the PAG in order to enhance the PAG solubility in the developer.

A yet further object of the prevent invention is to provide a strongly water-soluble photoacid generator in resist compositions to avoid blob defect formation by replacing methoxy groups with hydroxy groups to transform the water-insoluble PAG {bis(t-butylphenyl)iodoniun 4-methoxybenzenesulfonate} to the water-soluble compound {bis(t-butylphenyl)iodonium 4-hydroxybenzenesulfonate} to prevent PAGs precipitation in the developer.

In general, the invention is accomplished by discovering and choosing strongly water-soluble photoacid generators (PAGs) and using the same in resist compositions to prevent blob defect formation. This entails incorporating strongly water-soluble PAGs in resist compositions to prevent the precipitation of non-decomposed PAG in the developer. In one embodiment, the invention process incorporates certain water-soluble groups such as —OH into the PAG to enhance PAG solubility in the developer

DESCRIPTION OF THE PREFERRED EMBODIMENTS

Figure 1:
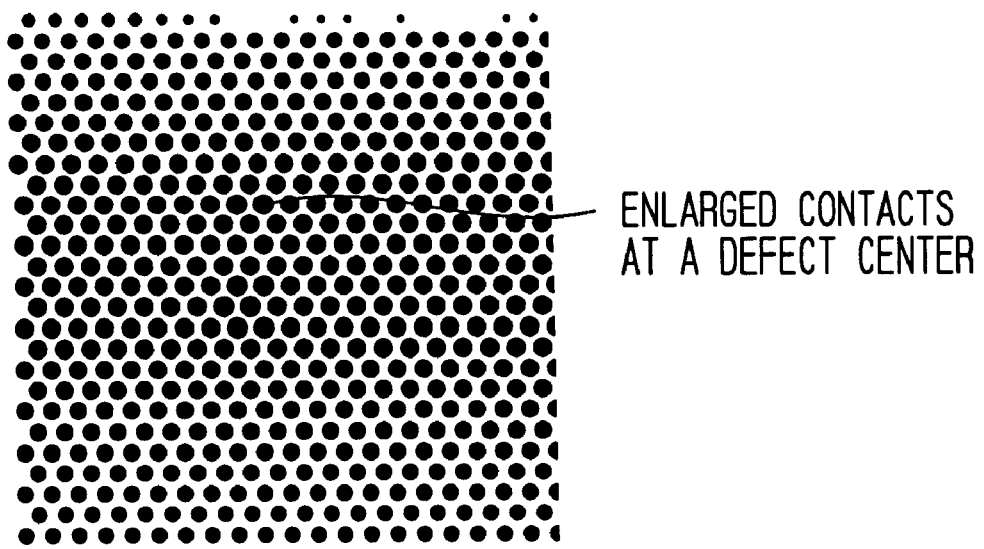
FIG. 1 depicts enlarged contact holes underneath blob defects after flood exposure, post-exposure bake and development.

The principles behind the invention approach is best understood best by going through the process of how chemical amplified resists (CARs) function. In general, CARs are typically composed of four components: a base polymer with a certain degree of protected groups; a photoacid generator(PAG); a base; and a solvent. Upon exposure to UV or other type of radiation, the PAG photodecomposes and generates a proton $H^+$. During a later post-exposure bake (PEB), the $H^+$ acts as a catalyst to convert the hydrophobic protected groups on the base polymer into strong hydrophilic groups such as —COOH, thereby causing dissolution contrast between exposed and unexposed areas in the developer.

Formulas I and II illustrate two types of prior art photoacid generator (PAG) martials; namely, iodonium salts and sulphonium salts, both of which are widely employed in chemically amplified resists.

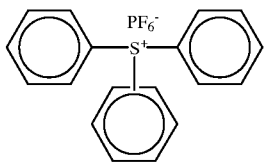

Formula I

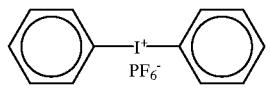

Formula II

As can be seen from Formulas I and II, both types of PAGs have strongly hydrophobic phenyl groups, thereby indicating poor solubility in polar solvent systems.

In this connection, it is important to point out that photoacid generators (PAGs) in chemically amplified resists compositions are not completely photo-decomposed. That is, due to their low photo-sensitivity, only a small portion of the PAG reacts in exposed film regions, while a major portion of the PAG remains unexposed after exposure. Therefore, as part of the exposed resist, the non-converted PAG will be dissolved in the developer. If the non-converted PAG has low solubility in the developer and is hydrophobic, it can combine with other low molecular weight molecules to form aggregates or micelles.

Experimental results provide evidence of un-decomposed PAGs inside of the blob defects. For example, Auger chemical analysis confirms the presence of sulfur inside of blob defects observed with Shipley UV82 resists. Since the counter-ion of the PAG contains sulfur, the Auger results confirms that PAG is included in the blob defects.

Also, the fact is that the contact holes underneath the blob defects are significantly enlarged if flood exposure, post-exposure bake (PEB), and development is performed after normal lithographic processing of the UV82 resist, thereby further confirming the presence of PAG inside of the blob defects, as can be seen from FIG. 1, which shows enlarged contacts after flood exposure, post exposure bake (PEB), and development.

To resolve the problem of PAGs in blob defects as well as the significantly enlarged contact holes underneath blob defects upon flood exposure, PEB and development after normal lithographic processing, the invention process utilizes a strongly water-soluble PAG in the resist composition, thereby preventing the precipitation of non-decomposed PAG in the developer.

In one embodiment of the invention, certain water-soluble groups, i.e. —OH are incorporated into the photoacid generator to provide enhanced PAG solubility in the developer.

For example, the invention replaces methoxy groups with hydroxy groups to transform the water-insoluble PAG {bis(t-butylphenyl)iodonium 4-methoxybenzenesulfonate} to the water-soluble compound {bis(t-butylphenyl)iodonium 4-hydroxybenzensulfonate} to prevent PAG precipitation in the developer.

Therefore, by the use of water-soluble bis(t-butylphenyl) iodonium 4-hydroxybenzensulfonate in the developer, the PAG precipitation is prevented.

The formula for another waste-soluble PAG of the invention that eliminates blob defects is shown in Formula III.

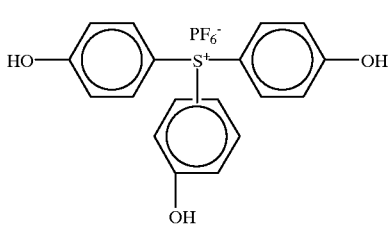

Formula II

Although the examples herein are directed to only a few of the many variables included in the strongly water-soluble photoacid generator resist compositions of the invention, it is to be understood that a broad variety of strongly water-soluble photoacid generator resist compositions are encompassed within the scope of the present invention, and that the specific embodiments are not to be construed as limiting or detracting from the inventive concept, which is defined by the appended claims.

We claim:

1. A chemically amplified resist composition that eliminates blob defects when used to produce semiconductor devices comprising: a base polymer with a protected group; a solvent; and a photoacid generator comprising an iodonium salt containing a water-soluble hydroxyl group, of {bis(t-butylphenyl)iodium-4-hydroxybenzensulfonate}.

2. A process of using a photoacid generator in a resist composition to prevent blob defect formation comprising: preparing a resist composition comprising a base polymer with a protected group, base solvent, and a photoacid generator of an iodonium salt containing a water-soluble hydroxyl group; exposing said resist to radiation to photo-decompose PAG and generate a proton $H^+$; and post-exposure baking (PEB) said composition to cause the $H^+$ to act as a catalyst to convert hydrophobic protected groups on said base polymer to strong hydrophilic groups to cause dissolution contrast between exposed and unexposed areas in the developer to prevent blob defect formation; wherein said iodonium salt containing a water-soluble hydroxyl group is {bis(t-butylphenyl)iodium-4-hydroxybenzensulfonate}.

* * * * *